(12) United States Patent
Fujisawa

(10) Patent No.: US 11,417,544 B2
(45) Date of Patent: Aug. 16, 2022

(54) EXPANDING APPARATUS

(71) Applicant: DISCO CORPORATION, Tokyo (JP)

(72) Inventor: Shinichi Fujisawa, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 17/032,837

(22) Filed: Sep. 25, 2020

(65) Prior Publication Data
US 2021/0013062 A1    Jan. 14, 2021

Related U.S. Application Data

(62) Division of application No. 16/376,391, filed on Apr. 5, 2019, now Pat. No. 10,818,524.

(30) Foreign Application Priority Data

Apr. 12, 2018    (JP) .............................. JP2018-077120

(51) Int. Cl.
*H01L 21/67*    (2006.01)
*H01L 21/52*    (2006.01)
(Continued)

(52) U.S. Cl.
CPC ........ *H01L 21/67098* (2013.01); *H01L 21/52* (2013.01); *H01L 21/67092* (2013.01);
(Continued)

(58) Field of Classification Search
CPC .............. H01L 21/78; H01L 21/67132; H01L 21/67098; H01L 21/67092; H01L 21/683;
(Continued)

(56) References Cited

U.S. PATENT DOCUMENTS

2006/0060129 A1*  3/2006  Hirano ................... C30B 15/20
117/20
2007/0157886 A1*  7/2007  Elgar .................. G03F 7/70875
118/729

(Continued)

FOREIGN PATENT DOCUMENTS

JP    2007189057 A    7/2007
JP    2009064905 A    3/2009

OTHER PUBLICATIONS

Office action issued in counterpart German patent application No. 10 2019 205 234.7, dated Jul. 30, 2021.

*Primary Examiner* — Thanh T Nguyen
(74) *Attorney, Agent, or Firm* — Greer Burns & Crain, Ltd.

(57) ABSTRACT

An expanding apparatus for expanding an expansion sheet to which a workpiece including at least a ductile material is adhered. The expanding apparatus includes expanding means for expanding the expansion sheet. The expanding means includes a plurality of moving units that are each configured and arranged to move an associated holding unit, and wherein each of the holding units is configured and arranged to clamp and hold a portion of the expansion sheet. The apparatus also includes cooling/heating means with a plate having a contact surface for contacting the workpiece, and a Peltier element for cooling or heating the plate. Finally, the apparatus includes a polarity change-over means for changing over the polarity of current passed to the Peltier element, wherein the polarity change-over means is configured and arranged to be switched between one status in which the plate is cooled and another status in which the plate is heated.

7 Claims, 10 Drawing Sheets

(51) Int. Cl.
*H01L 35/32* (2006.01)
*H01L 21/78* (2006.01)
*H01L 21/683* (2006.01)

(52) U.S. Cl.
CPC ............ *H01L 21/683* (2013.01); *H01L 21/78* (2013.01); *H01L 35/32* (2013.01)

(58) Field of Classification Search
CPC ... H01L 35/32; H01L 21/52; H01L 21/67109; H01L 2221/68336
See application file for complete search history.

(56) References Cited

U.S. PATENT DOCUMENTS

| | | |
|---|---|---|
| 2007/0224839 A1 | 9/2007 | Shimizu |
| 2015/0348821 A1 | 12/2015 | Iwanaga et al. |
| 2018/0269104 A1 | 9/2018 | Grivna |
| 2018/0342423 A1 | 11/2018 | Grivna et al. |

\* cited by examiner

EXPANDING APPARATUS

This is a divisional application of application Ser. No. 16/376,391 filed Apr. 5, 2019, which claims the benefit of Japanese Patent Application No. 2018-077120, filed on Apr. 12, 2018.

BACKGROUND OF THE INVENTION

Field of the Invention

The present invention relates to an expanding method and an expanding apparatus.

Description of the Related Art

At the time of dividing a die attach film (DAF) by expanding an expansion sheet, the expansion is conducted while cooling the workpiece in a cooling chamber, for enhancing the dividability of the DAF which is a ductile material (see, for example, Japanese Patent Laid-Open No. 2009-64905 and Japanese Patent Laid-Open No. 2007-189057).

SUMMARY OF THE INVENTION

However, the dividing method described in Japanese Patent Laid-Open No. 2009-64905 and Japanese Patent Laid-Open No. 2007-189057 has a problem that the apparatus is enlarged in size due to the presence of the cooling chamber. In view of this, it may be contemplated to cool the workpiece by putting a cooling plate into contact with the workpiece. However, cooling of the workpiece is accompanied by cooling of the atmosphere surrounding the workpiece, whereby frost or dew would be generated on the surface of the workpiece. If frost or dew is generated on the workpiece surface, a trouble such as impossibility of picking-up may be generated in a later picking-up step or the like.

It is therefore an object of the present invention to provide an expanding method and an expanding apparatus in which a trouble due to frost or dew deposited on the surface of a workpiece can be restrained from being generated in a later step.

In accordance with an aspect of the present invention, there is provided an expanding method for expanding an expansion sheet to which a workpiece including at least a ductile material is adhered. The expanding method includes a plate cooling step of cooling a plate of cooling/heating means, which includes the plate having a contact surface for contact with the workpiece and a Peltier element for cooling or heating the plate, to a temperature to which to cool the workpiece, a workpiece cooling step of bringing the plate into contact with the workpiece through the expansion sheet to cool the workpiece, after the plate cooling step is performed, an expanding step of expanding the expansion sheet, after the workpiece cooling step is performed, a plate heating step of heating the plate, after the workpiece cooling step is performed, and a workpiece heating step of bringing the plate into contact with the workpiece through the expansion sheet to heat the workpiece, after the expanding step and the plate heating step are performed.

In accordance with another aspect of the present invention, there is provided an expanding apparatus for expanding an expansion sheet to which a workpiece including at least a ductile material is adhered. The expanding apparatus includes expanding means expanding the expansion sheet, cooling/heating means that includes a plate having a contact surface for contact with the workpiece and brought into contact with the workpiece through the expansion sheet, and a Peltier element for cooling or heating the plate, and polarity change-over means hanging over the polarity of a current passed to the Peltier element.

According to the present invention, such an effect that a trouble due to frost or dew deposited on the surface of a workpiece can be restrained from being generated in a later step.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
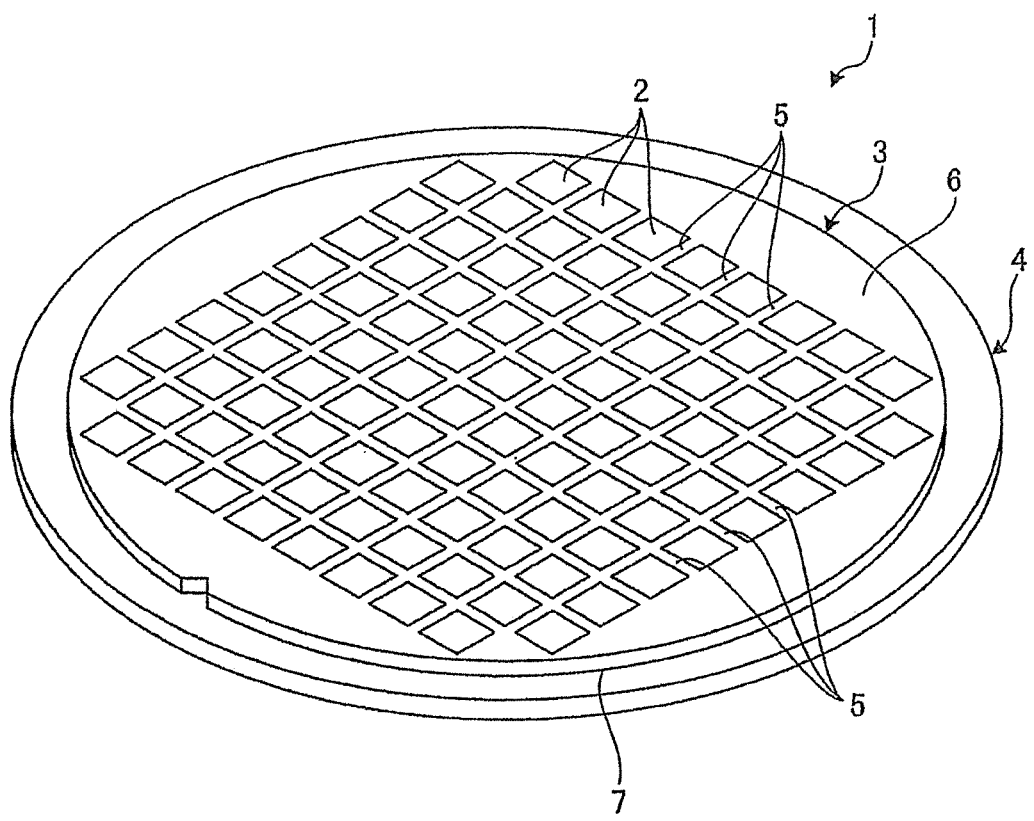
FIG. 1 is a perspective view of a workpiece as an object to be processed by an expanding method according to an embodiment of the present invention.

An embodiment of the present invention will be described in detail below, referring to the drawings. The contents of the following description of the embodiment are not restrictive of the present invention. In addition, the constituent elements described below include those which are easily conceivable by persons skilled in the art, and those which are substantially the same. Further, the configurations described below can be combined, as required. Besides, various omissions, replacements or modifications of configurations are possible without departing from the scope of the gist of the present invention.

Figure 2:
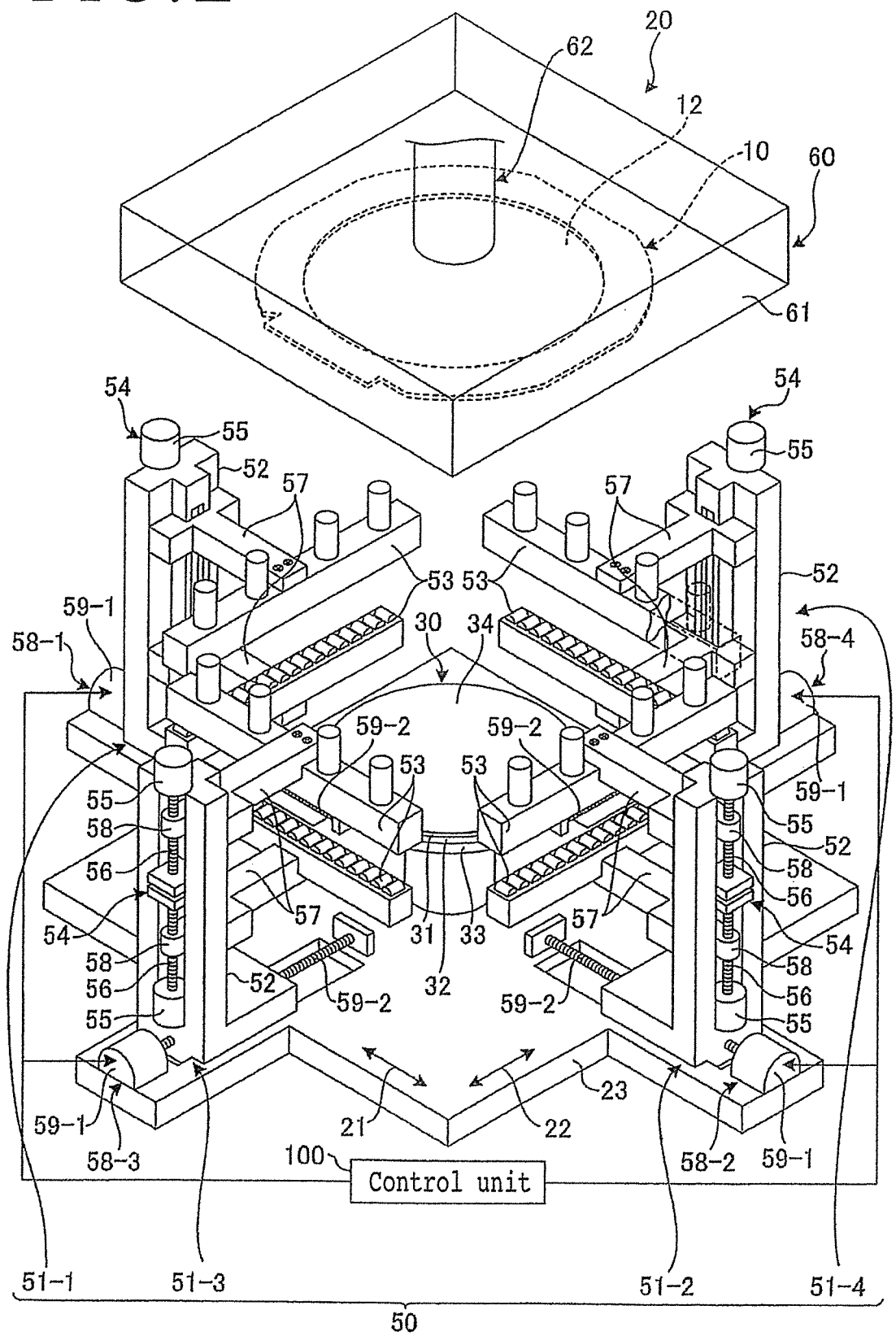
FIG. 2 is a perspective view depicting a configuration example of an expanding apparatus according to an embodiment of the present invention.
Figure 3:
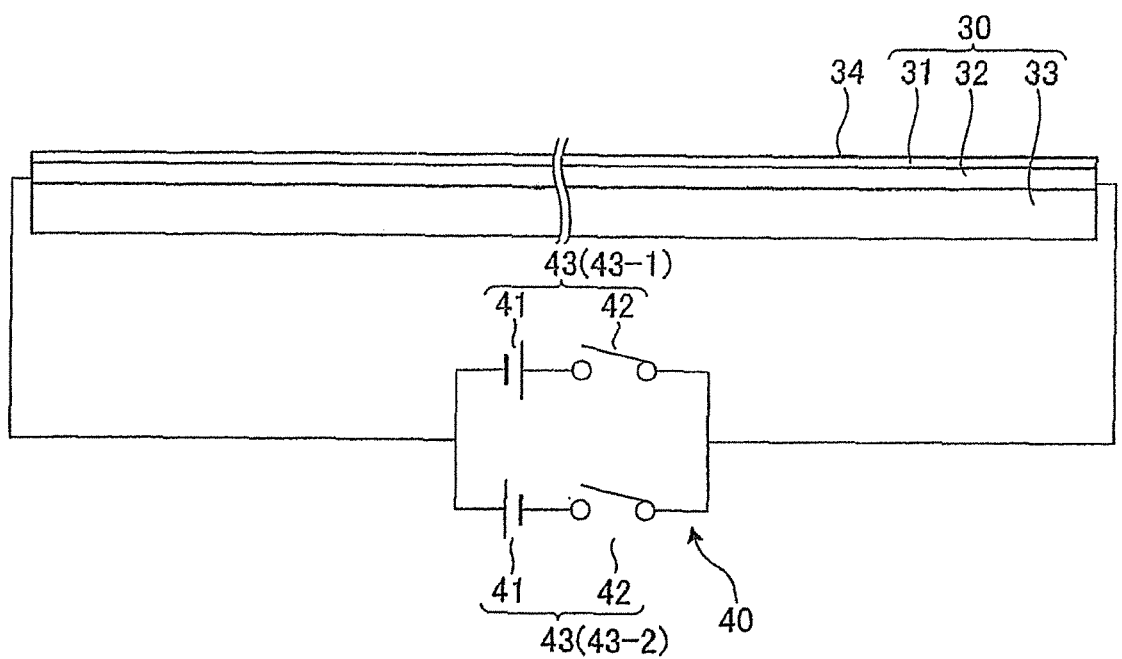
FIG. 3 is a side view depicting the configuration of a cooling/heating unit of the expanding apparatus illustrated in FIG. 2.
Figure 4:
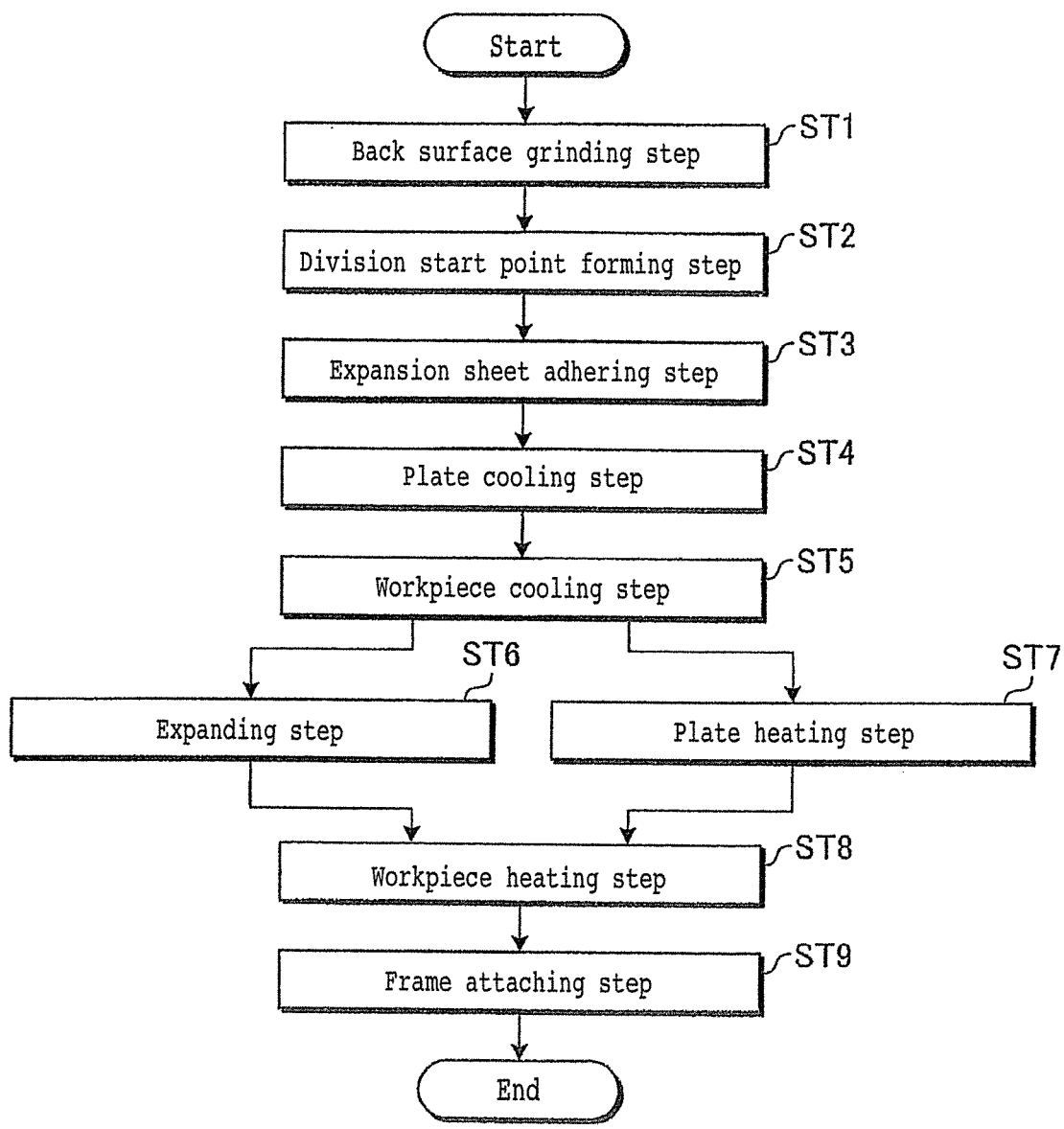
FIG. 4 is a flow chart depicting the flow of the expanding method according to the embodiment.

An expanding method and an expanding apparatus according to an embodiment of the present invention will be described based on the drawings. FIG. 1 is a perspective view of a workpiece as an object to be processed by the expanding method according to the embodiment. FIG. 2 is a perspective view depicting a configuration example of the expanding apparatus according to the embodiment. FIG. 3 is a side view depicting the configuration of a cooling/heating unit of the expanding apparatus illustrated in FIG. 2. FIG. 4 is a flow chart depicting the flow of the expanding method according to the embodiment.

The expanding method according to the embodiment is a method of expanding an expansion sheet 11 (illustrated in FIG. 7) to which a workpiece 1 denoted in FIG. 1 is adhered, to divide the workpiece 1 into individual devices 2. The workpiece 1 as an object to be processed by the expanding method according to the embodiment includes at least a wafer 3 such as a disk-shaped semiconductor wafer or an optical device wafer with a substrate of silicon, sapphire, gallium arsenide or SiC (silicon carbide), and a DAF 4 adhered to the wafer 3. As illustrated in FIG. 1, the wafer 3 has a front surface 6 formed with devices 2 respectively in regions partitioned by a plurality of intersecting streets (division lines) 5. The DAF 4 is for fixing to a substrate or the like the devices 2 divided individually from the wafer 3, and is an elastic ductile material. In the embodiment, the DAF 4 is formed in a disk shape larger in diameter than the wafer 3, and is adhered to a back surface 7 on the back side of the front surface 6 of the wafer 3. Note that while the DAF 4 is depicted as a ductile material included by the workpiece 1 in the embodiment, the ductile material in the present invention is not limited to the DAF 4, and may be a metal film (an electrode or a heat sink or the like) formed on the back surface 7 of the wafer 3, a test element group (TEG) pattern disposed on the streets 5, or the like.

The expanding apparatus 20 illustrated in FIG. 2 according to the embodiment is an apparatus that expands an expansion sheet 11 with the workpiece 1 adhered thereto in a first direction 21 and a second direction 22 orthogonal to the first direction 21, to divide the workpiece 1 into individual devices 2. The expanding apparatus 20 is also an apparatus that adheres an annular frame 10 to the expansion sheet 11 to which the workpiece 1 divided into the individual devices 2 is adhered, to support the workpiece 1 at an opening 12 of the frame 10. Note that the expansion sheet 11 is an elastic sheet, and it includes a base material layer configured using a synthetic resin, and an adhesive layer laminated on the base material layer and adhered to the back surface 7 of the workpiece 1 and the frame 10. The shape of the opening 12 of the frame 10 is a circle larger in diameter than the wafer 3 and the DAF 4.

As depicted in FIG. 2, the expanding apparatus 20 includes a flat plate-shaped stationary base 23, a cooling/heating unit 30 as cooling/heating means provided in the center of the stationary base 23, a polarity change-over power source unit 40 (illustrated in FIG. 3) as polarity change-over means, an expansion sheet fixing unit 50, a frame carrying unit 60, a workpiece carrying unit (not depicted), a sheet cutting unit 70 (depicted in FIG. 15), and a control unit 100.

The cooling/heating unit 30 is formed, for example, in a disk-like shape. Note that while the cooling/heating unit 30 is formed in a disk-like shape in the embodiment, the shape in the present invention is not limited to the disk-like shape, and may be a rectangular shape, for example. As illustrated in FIG. 3, the cooling/heating unit 30 includes a plate 31, a Peltier element layer 32, and a heat radiation plate 33.

Figure 7:
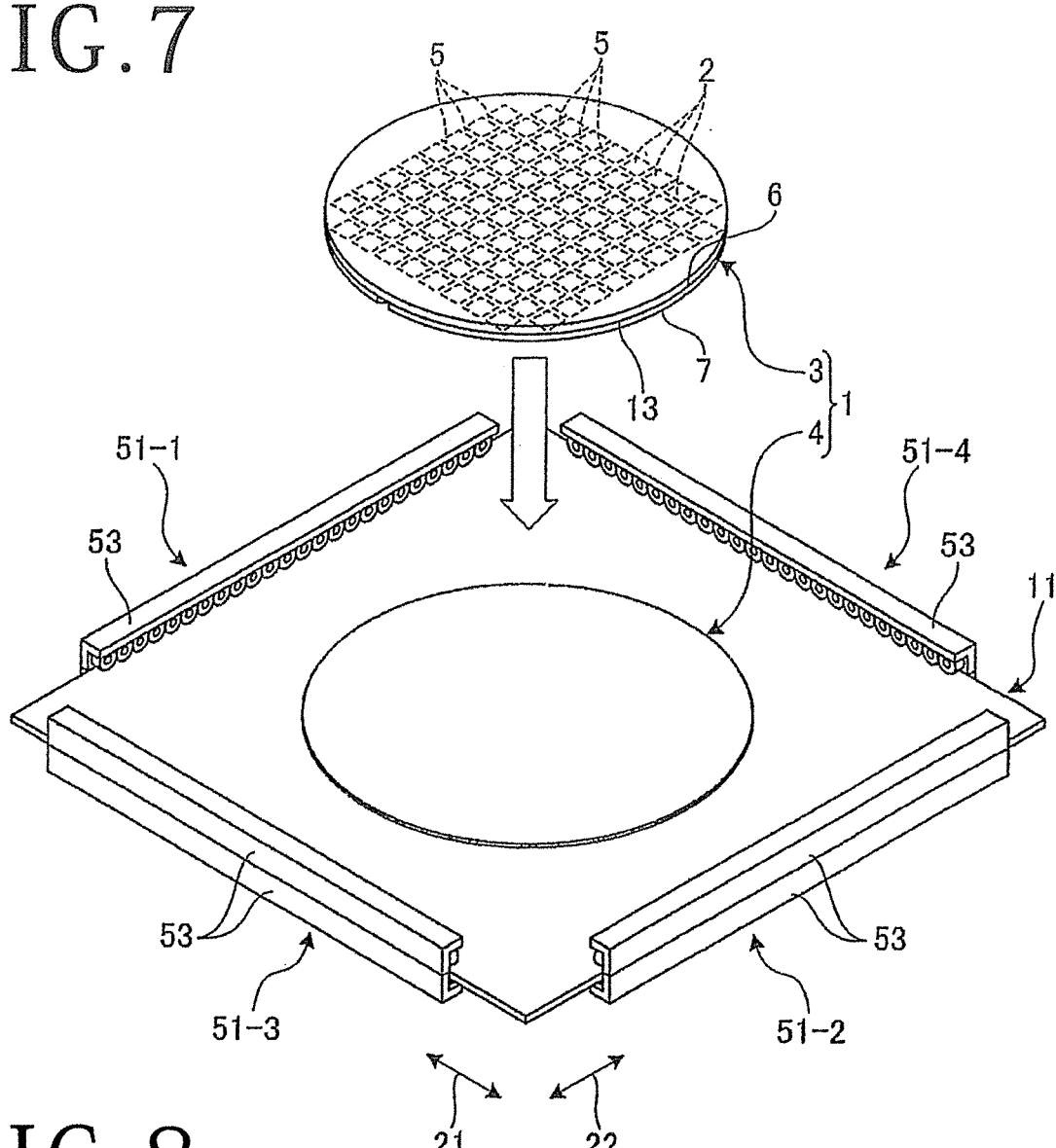
FIG. 7 is a perspective view depicting an outline of an expansion sheet adhering step of the expanding method depicted in FIG. 4.

As depicted in FIG. 3, an upper surface 34 of the plate 31 is a contact surface which is formed to be flat along horizontal directions and makes contact with the workpiece 1. The plate 31 has the workpiece 1 placed on the upper surface 34 thereof with the expansion sheet 11 interposed therebetween, and makes contact with the workpiece 1 through the expansion sheet 11. In the embodiment, as depicted in FIG. 7, the expansion sheet 11 placed on the upper surface 34 of the plate 31 is adhered to the back surface 7 of the workpiece 1 and has the workpiece 1 placed in the center thereof. The expansion sheet 11 is formed in a plan-view shape which is rectangular and is larger than the frame 10.

The plate 31 is configured using a metal having a high thermal conductivity such as stainless steel (for example, SUS303 (JIS)) or an aluminum alloy (for example, AL052 (JIS)). The plate 31 is formed in such a thickness as not to be influenced by ruggedness (projections and recesses) of the Peltier element layer 32 in which a plurality of Peltier elements are arranged, and to prevent warping of the plate 31 itself; in the embodiment, the thickness of the plate 31 is 1 to 3 mm, desirably 3 mm.

The Peltier element layer 32 is laminated on a lower surface of the plate 31. In other words, an upper surface of the Peltier element layer 32 is laminated on the lower surface of the plate 31. The Peltier element layer 32 includes the plurality of Peltier elements for cooling or heating the plate 31.

The heat radiation plate 33 is laminated on a lower surface of the Peltier element layer 32, and, in the embodiment, it is formed in a plate-like shape using a metal. The heat radiation plate 33 is formed to have a high heat capacity, using a metal such as an aluminum alloy which is high in specific heat or stainless steel which is high in mass. The heat radiation plate 33 is preferably set in size and thickness taking convection heat loss and radiation heat loss into account; where the heat radiation plate is formed to be, for example, 360 mm square using an aluminum alloy, its thickness is desirably not less than 5 mm, and where the heat radiation plate is similarly configured using stainless steel, its thickness is desirably not less than 3 mm. In addition, where the heat radiation plate 33 is configured using stainless steel, for enhancing the cooling rate of the workpiece 1 by the plate 31, it is preferable, for example, that the thickness of the heat radiation plate is approximately 20 mm. With the heat radiation plate 33 thus formed to have a high heat capacity such as to be able to sufficiently store the heat generated when the plate 31 is cooled, it is unnecessary for the cooling/heating unit 30 to be provided with a mechanism such as a fan by which the heat transferred to the heat radiation plate 33 side is released to the outside of the heat radiation plate 33.

The polarity change-over power source unit 40 passes a current to the Peltier elements in the Peltier element layer 32, and changes over the polarity of the current passed to the Peltier elements in the Peltier element layer 32. The polarity change-over power source unit 40 has two power source units 43 each of which includes a direct current (DC) power source 41 and a switch 42 connected in series with each other. The two power source units 43 are connected in parallel to each other, and are connected to the Peltier element layer 32. When the switch 42 of the power source unit 43 on one side, on the upper side in FIG. 3, in the polarity change-over power source unit 40 (this power source unit 43 will hereinafter be denoted by reference symbol 43-1) is closed to impress a voltage from the DC power source 41 of the power source unit 43-1 on the one side to the Peltier elements in the Peltier element layer 32, heat absorption occurs on the upper surface side of the Peltier element layer 32 to cool the plate 31, whereas heat discharge occurs on the lower surface side of the Peltier element layer 32 to heat the heat radiation plate 33. On the other hand, when the switch 42 of the power source unit 43 on the other side, on the lower side in FIG. 3, in the polarity change-over power source unit 40 (this power source unit 43 will hereinafter be denoted by reference symbol 43-2) is closed to impress a voltage from the DC power source 41 of the power source unit 43-2 on the other side to the Peltier elements in the Peltier element layer 32, heat absorption occurs on the lower surface side of the Peltier element layer 32 to cool the heat radiation plate 33, whereas heat discharge occurs on the upper surface side of the Peltier element layer 32 to heat the plate 31. In this way, the cooling/heating unit 30 includes the Peltier elements that cool or heat the plate 31.

The expansion sheet fixing unit 50 is for holding the expansion sheet 11 with the workpiece 1 adhered thereto. The expansion sheet fixing unit 50 includes a first holding unit 51-1, a second holding unit 51-2, a third holding unit 51-3, and a fourth holding unit 51-4. The first holding unit 51-1 and the second holding unit 51-2 face each other along the first direction 21, with the cooling/heating unit 30 located therebetween. The third holding unit 51-3 and the fourth holding unit 51-4 face each other along the second direction 22, with the cooling/heating unit 30 located therebetween.

The first holding unit 51-1, the second holding unit 51-2, the third holding unit 51-3, and the fourth holding unit 51-4 each clamp and hold that portion of the expansion sheet 11 which is on the outer circumference side relative to the workpiece 1. The first holding unit 51-1, the second holding unit 51-2, the third holding unit 51-3, and the fourth holding unit 51-4 are each holding means for respectively holding each edge of the expansion sheet 11. Since the first holding unit 51-1, the second holding unit 51-2, the third holding unit 51-3, and the fourth holding unit 51-4 are substantially the same with one another in configuration, the equivalent portions will be described while being denoted by the same reference symbols.

The first holding unit 51-1, the second holding unit 51-2, the third holding unit 51-3, and the fourth holding unit 51-4 each include a pair of clamping members 53 vertically movably provided on a columnar movable base 52 provided on the stationary base 23, and a tape moving unit 54 that moves the pair of clamping members 53 toward and away from each other. The pair of clamping members 53 are disposed with a vertical spacing therebetween, and are brought closer to each other by the tape moving unit 54, to clamp and hold the expansion sheet 11 therebetween. The tape moving unit 54 is provided on the movable base 52.

The tape moving unit 54 includes: a motor 55 by which the pair of clamping members 53 are vertically movable, a ball screw 56 rotated around an axis by the motor 55, and nuts 58 making screw engagement with the ball screw 56 and each connected with the clamping member 53 through an arm member 57. With the motor 55 rotating the ball screw 56 around the axis, the tape moving unit 54 moves the nuts 58, the arm members 57 and the clamping members 53 vertically.

In addition, with the ball screw 56 rotated around the axis by the motor 55, the tape moving unit 54 can also move the pair of clamping members 53 in the same direction vertically. Therefore, by moving upward the pair of clamping members 53 with the expansion sheet 11 clamped therebetween, the tape moving unit 54 can move the expansion sheet 11 vertically in the direction for spacing away from the cooling/heating unit 30.

Besides, the movable base 52 provided with the pair of clamping members 53 and the tape moving unit 54 of the first holding unit 51-1 is provided on the stationary base 23 such as to be movable in the first direction 21 by a first moving unit 58-1. The movable base 52 provided with the pair of clamping members 53 and the tape moving unit 54 of the second holding unit 51-2 is provided on the stationary base 23 such as to be movable in the first direction 21 by a second moving unit 58-2. The movable base 52 provided with the pair of clamping members 53 and the tape moving unit 54 of the third holding unit 51-3 is provided on the stationary base 23 such as to be movable in the second direction 22 by a third moving unit 58-3. The movable base 52 provided with the pair of clamping members 53 and the tape moving unit 54 of the fourth holding unit 51-4 is provided on the stationary base 23 such as to be movable in the second direction 22 by a fourth moving unit 58-4.

Since the first moving unit 58-1, the second moving unit 58-2, the third moving unit 58-3, and the fourth moving unit 58-4 are substantially the same with one another in configuration, the equivalent portions will be described while being denoted by the same reference symbols.

The first moving unit 58-1, the second moving unit 58-2, the third moving unit 58-3, and the fourth moving unit 58-4 each include a motor 59-1 by which the corresponding one of the holding units 51-1, 51-2, 51-3, and 51-4 can be moved in the first direction 21 or the second direction 22, and a ball screw 59-2 which is rotated around an axis by the motor 59-1 and moves the movable base 52 in the first direction 21 or the second direction 22.

The first moving unit 58-1, the second moving unit 58-2, the third moving unit 58-3, and the fourth moving unit 58-4 constitute expanding means for expanding the expansion sheet 11 held by the holding units 51-1, 51-2, 51-3, and 51-4, by moving the holding units 51-1, 51-2, 51-3, and 51-4 in the directions for spacing away from each other in the first direction 21 or the second direction 22.

In the embodiment, the frame carrying unit 60 is disposed on the upper side of the expansion sheet fixing unit 50, is formed in a thick flat plate-like shape, and holds the frame 10 on a lower surface 61 thereof. The frame carrying unit 60 is provided such as to be movable in the vertical direction by a lift unit 62, and to be movable in horizontal directions by a horizontal direction moving unit (not depicted). The frame carrying unit 60 is disposed, by the horizontal direction moving unit, at such a position that the opening 12 of the frame 10 held on the lower surface 61 thereof is coaxial with the plate 31, whereby the frame 10 is positioned at such a position that the opening 12 of the frame 10 and the workpiece 1 adhered to the expansion sheet 11 placed on the plate 31 face each other in the vertical direction. In addition, by being lowered by the lift unit 62, the frame carrying unit 60 adheres the frame 10 to the expansion sheet 11.

The workpiece carrying unit is disposed on the upper side of the expansion sheet fixing unit 50, and holds the workpiece 1 on a lower surface thereof. The workpiece carrying unit is provided such as to be movable in the vertical direction by a lift unit, and to be movable in horizontal directions by a horizontal direction moving unit. The workpiece carrying unit is disposed, by the horizontal direction moving unit, at such a position that the workpiece 1 held on the lower surface thereof is coaxial with the plate 31, whereby the workpiece 1 is positioned at such a position as to face the plate 31 in the vertical direction. In addition, by being lowered by the lift unit, the workpiece carrying unit adheres the workpiece 1 to the expansion sheet 11.

The sheet cutting unit 70 is for cutting the expansion sheet 11 adhered to the frame 10 along the frame 10. As denoted in FIG. 15, the sheet cutting unit 70 includes a cutter 71 for cutting the expansion sheet 11.

The control unit 100 is for controlling the components of the expanding apparatus 20, thereby causing the expanding apparatus 20 to perform an operation of expanding the expansion sheet 11 and an operation of adhering the expansion sheet 11 to the frame 10. Note that the control unit 100 is a computer that includes an arithmetic processing apparatus having a microprocessor such as a central processing unit (CPU), a storage apparatus having a memory such as a read only memory (ROM) or a random access memory (RAM), and an input-output interface apparatus. The arithmetic processing apparatus of the control unit 100 executes arithmetic processing according to a computer program stored in the storage apparatus, and outputs control signals for controlling the expanding apparatus 20 to the components of the expanding apparatus 20 through the input-output interface apparatus. In addition, the control unit 100 is connected with a display unit (not depicted) configured using a liquid crystal display or the like that displays various kinds of information and images and the like, and an input unit (not depicted) for use by an operator when registering information on the contents of processing or the like. The input unit is configured using at least one of a touch panel provided on the display unit and an external input apparatus such as a keyboard.

Note that in the present invention, the expanding apparatus 20 may include a sheet holding unit that holds the expansion sheet 11 in a rolled form, a delivery unit that delivers the expansion sheet 11 from the sheet holding unit to the holding units 51-1, 51-2, 51-3, and 51-4, and a cutting unit that cuts the expansion sheet 11 delivered from the delivery unit, in addition to the above-mentioned components.

As depicted in FIG. 4, the expanding method according to the embodiment includes a back surface grinding step ST1, a division start point forming step ST2, an expansion sheet adhering step ST3, a plate cooling step ST4, a workpiece cooling step ST5, an expanding step ST6, a plate heating step ST7, a workpiece heating step ST8, and a frame attaching step ST9.

<Back Surface Grinding Step>

Figure 5:
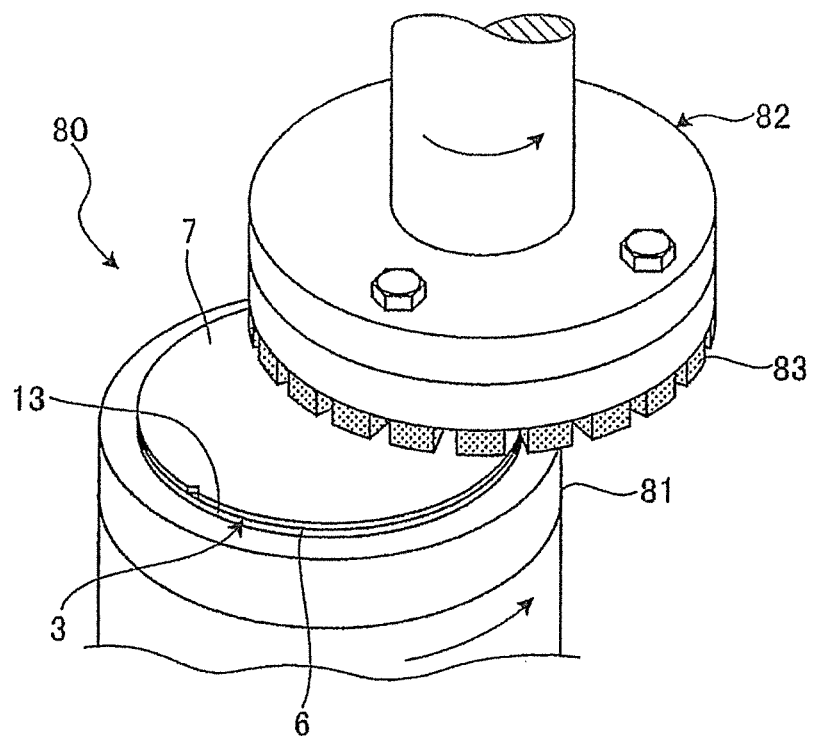
FIG. 5 is a perspective view depicting a back side grinding step of the expanding method depicted in FIG. 4.

FIG. 5 is a perspective view depicting a back surface grinding step of the expanding method depicted in FIG. 4. The back surface grinding step ST1 is a step of grinding the back surface 7 of the wafer 3 of the workpiece 1, to thin the wafer 3 to a desired finished thickness.

In the back surface grinding step ST1, first, a protective tape 13 is adhered to the front surface 6 of the wafer 3. In the embodiment, the protective tape 13 which is equal in diameter to the wafer 3 is used. In the back surface grinding step ST1, as depicted in FIG. 5, a grinding apparatus 80 suction holds the front surface 6 of the wafer 3 on a chuck table 81 with the protective tape 13 interposed therebetween, and, while rotating the chuck table 81 around an axis, grindstones 83 of a grinding unit 82 are rotated around an axis and brought into contact with the back surface 7 of the wafer 3, to grind the back surface 7. After the back surface grinding step ST1, the expanding method proceeds to the division start point forming step ST2.

<Division Start Point Forming Step>

Figure 6:
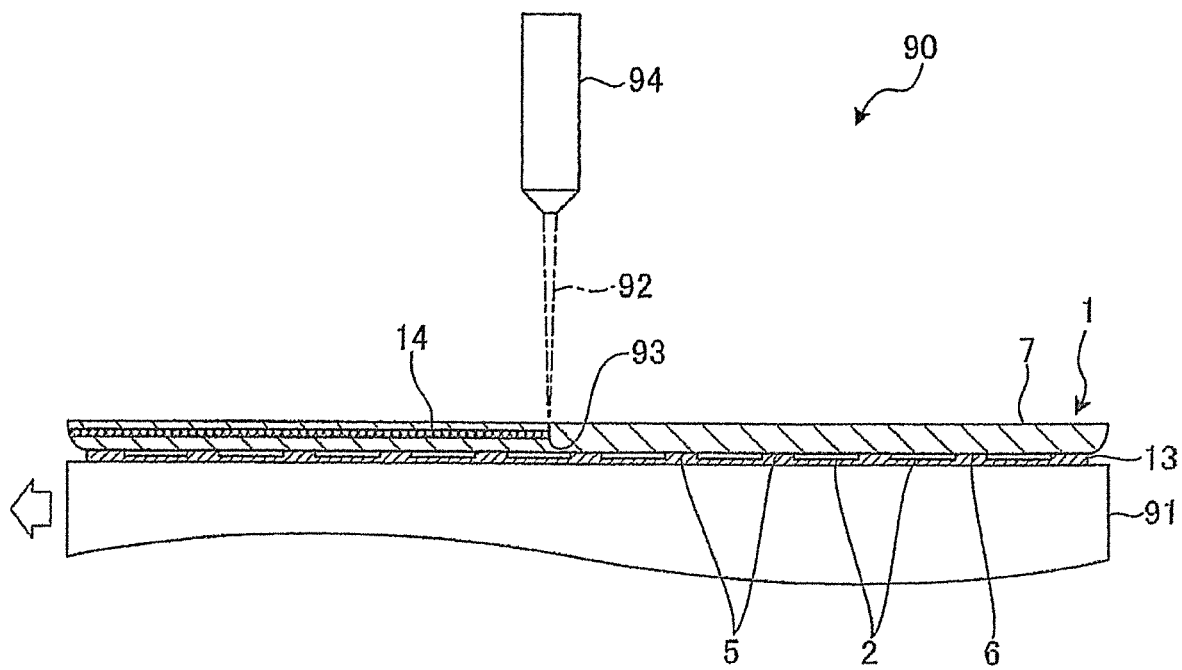
FIG. 6 is a sectional view depicting a division start point forming step of the expanding method depicted in FIG. 4.

FIG. 6 is a sectional view depicting the division start point forming step of the expanding method depicted in FIG. 4. The division start point forming step ST2 is a step of forming the wafer 3 of the workpiece 1 with modified layers 14 as division start points along the streets.

In the division start point forming step ST2, as illustrated in FIG. 6, a laser processing apparatus 90 suction holds the front surface 6 of the wafer 3 on a chuck table 91 with the protective tape 13 interposed therebetween, and a laser beam of such a wavelength as to be transmitted through the workpiece 1 is applied from the back surface 7 side of the workpiece 1 along the streets 5. In the division start point forming step ST2, a focal point 93 of the laser beam 92 is set in the inside of the wafer 3, and the laser beam 92 is applied to the workpiece 1 while moving the workpiece 1 and a laser beam applying unit 94 relative to each other along the streets 5. In the division start point forming step ST2, the modified layers 14 as division start points along the streets 5 are formed in the inside of the wafer 3.

Note that the modified layer 14 means a region where density, refractive index, mechanical strength or other physical property is different from that in the surroundings, and examples thereof include a melting treatment region, a crack resin, a dielectric breakdown region, a refractive index change region, and a region in which these regions are mixedly present. Besides, in the embodiment, the workpiece 1 is formed therein with the modified layers 14 as the division start points, but cut grooves as division start points may be formed by cutting from the front surface 6 side, or laser processed grooves as division start points may be formed by laser ablation processing from the front surface 6 side. After the division start point forming step ST2, the expanding method proceeds to the expansion sheet adhering step ST3.

<Expansion Sheet Adhering Step>

Figure 8:
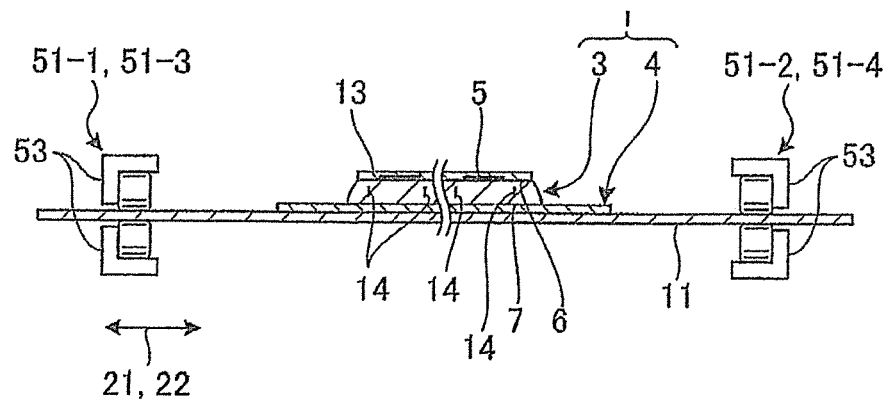
FIG. 8 is a sectional view depicting a workpiece and the like after the expansion sheet adhering step of the expanding method depicted in FIG. 4.

FIG. 7 is a perspective view depicting an outline of the expansion sheet adhering step of the expanding method denoted in FIG. 4. FIG. 8 is a sectional view depicting the workpiece and the like after the expansion sheet adhering step of the expanding method depicted in FIG. 4. The expansion sheet adhering step ST3 is a step of adhering the DAF 4 to the back surface 7 of the wafer 3, and adhering the expansion sheet 11 to the DAF 4 of the workpiece 1.

In the embodiment, in the expansion sheet adhering step ST3, as depicted in FIG. 7, the expanding apparatus 20 positions the expansion sheet 11, with the DAF 4 adhered to the center thereof, at a position spaced from the plate 31, and holds the expansion sheet 11 by the pairs of clamping members 53 of the holding units 51-1, 51-2, 51-3, and 51-4. In the expansion sheet adhering step ST3, the expanding apparatus 20 causes the back surface 7 of the wafer 3 held on the workpiece carrying unit to face the DAF 4, and lowers the workpiece carrying unit, to adhere the back surface 7 of the wafer 3 to the DAF 4, as depicted in FIG. 8. In the present invention, the DAF 4 adhered to the expansion sheet 11 may be adhered to the back surface 7 of the wafer 3 by an adhering roller (not depicted) from below the expansion sheet 11. In the expansion sheet adhering step ST3, the protective tape 13 is peeled off.

Note that in the embodiment, the back surface 7 of the wafer 3 is adhered to the DAF 4 adhered to the expansion sheet 11 in the expansion sheet adhering step ST3, but, in the present invention, the DAF 4 and the expansion sheet 11 may be sequentially adhered to the back surface 7 of the wafer 3. Specifically, in the present invention, the wafer 3 with the DAF 4 preliminarily adhered to the back surface 7 thereof may be held by the workpiece carrying unit, and may be adhered to the expansion sheet 11 held by the clamping members 53. After the expansion sheet adhering step ST3, the expanding method proceeds to the plate cooling step ST4.

<Plate Cooling Step>

Figure 9:
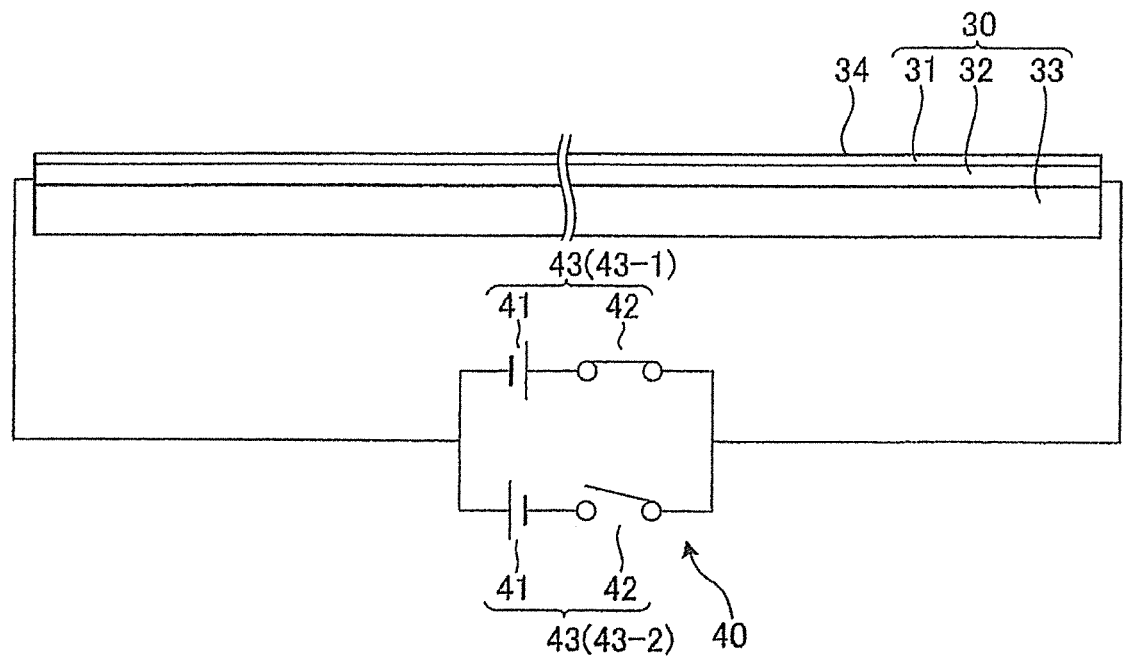
FIG. 9 is a side view of the cooling/heating unit depicting a plate cooling step of the expanding method depicted in FIG. 4.

FIG. 9 is a side view of the cooling/heating unit depicting the plate cooling step of the expanding method depicted in FIG. 4. The plate cooling step ST4 is a step of cooling the plate 31 of the cooling/heating unit 30 to a temperature to which the workpiece 1 is to be cooled.

In the embodiment, in the plate cooling step ST4, as depicted in FIG. 9, the expanding apparatus 20 closes the switch 42 of the power source unit 43-1 on one side of the polarity change-over power source unit 40, and keeps open the switch 42 of the power source unit 43-2 on the other side, to cool the plate 31 by the Peltier elements in the Peltier element layer 32. In the embodiment, in the plate cooling step ST4, the plate 31 is cooled until the temperature at the upper surface 34 thereof is brought to a desired cooling temperature, namely, a temperature of −20° C. to −15° C. After the plate cooling step ST4, the expanding method proceeds to the workpiece cooling step ST5.

<Workpiece Cooling Step>

Figure 10:
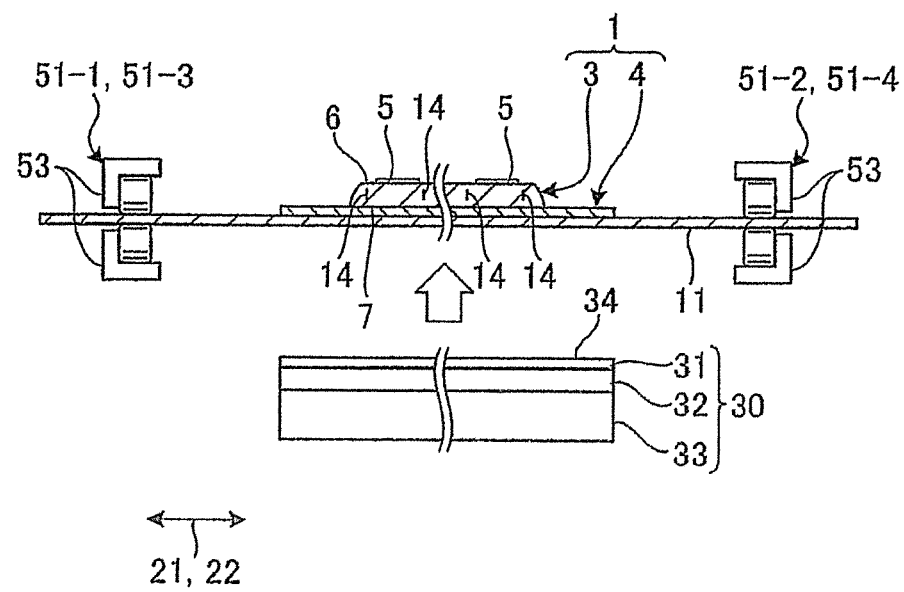
FIG. 10 is a side view depicting, partly in section, a major part of the expanding apparatus before a workpiece cooling step of the expanding method depicted in FIG. 4.
Figure 11:
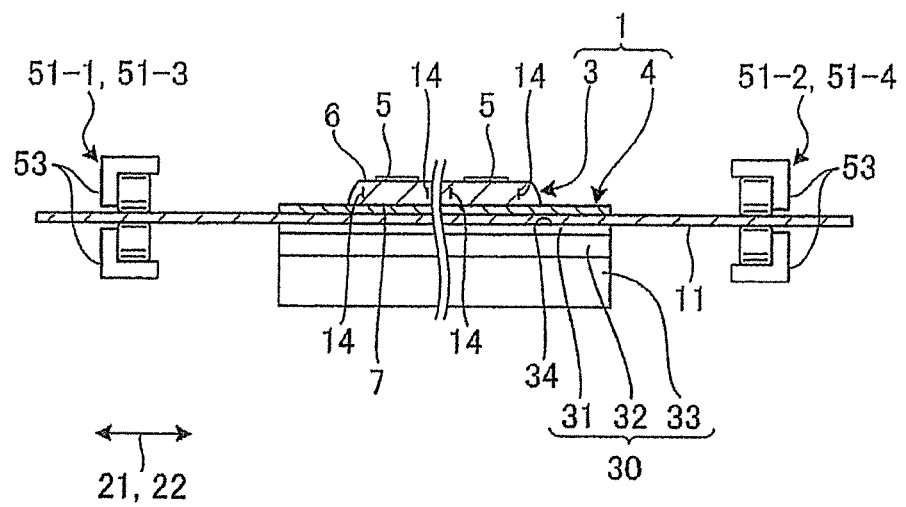
FIG. 11 is a side view depicting, partly in section, a workpiece cooling step of the expanding method depicted in FIG. 4.

FIG. 10 is a side view depicting, partly in section, a major part of the expanding apparatus before the workpiece cooling step of the expanding method depicted in FIG. 4. FIG. 11 is a side view depicting, partly in section, the workpiece cooling step of the expanding method depicted in FIG. 4.

The workpiece cooling step ST5 is a step of bringing the plate 31 into contact with the workpiece 1 through the expansion sheet 11 to cool the workpiece 1, after the plate cooling step ST4 is performed. In the embodiment, in the workpiece cooling step ST5, starting from the state in which the expansion sheet 11 is spaced from the upper surface 34 of the plate 31 as illustrated in FIG. 10, the expanding apparatus 20 causes the tape moving unit 54 to lower the expansion sheet 11, to bring the expansion sheet 11 into contact with the upper surface 34 of the plate 31, as depicted in FIG. 11. In the embodiment, in the workpiece cooling step ST5, the expanding apparatus 20 keeps the expansion sheet 11 in contact with the upper surface 34 of the plate 31 for 20 to 60 seconds, thereby to cool the wafer 3 and the DAF 4 of the workpiece 1. After the workpiece cooling step ST5, the expanding method proceeds to the expanding step ST6 and the plate cooling step ST7.

<Expanding Step>

Figure 12:
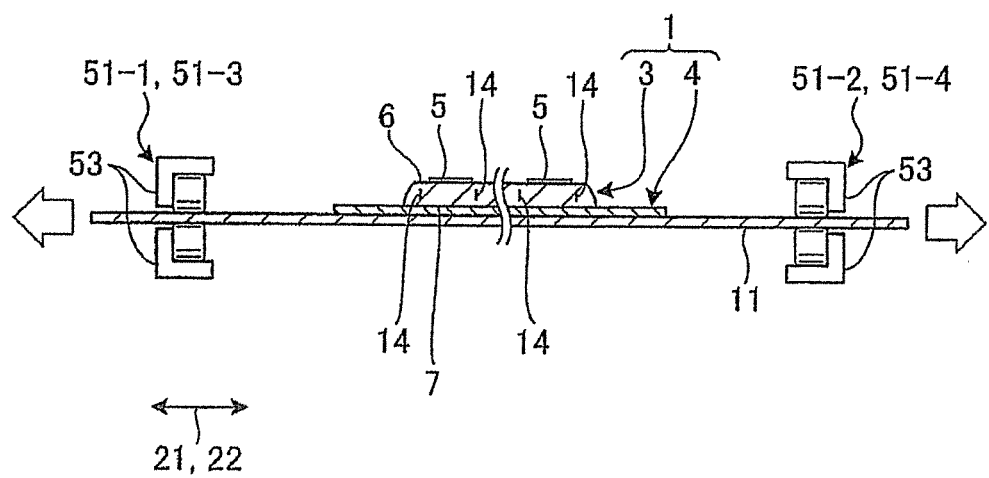
FIG. 12 is a side view depicting, partly in section, an expanding step of the expanding method depicted in FIG. 4.

FIG. 12 is a side view depicting, partly in section, the expanding step in the expanding method depicted in FIG. 4. The expanding step ST6 is a step of expanding the expansion sheet 11, after the workpiece cooling step ST5 is performed.

In the embodiment, in the expanding step ST6, the expanding apparatus 20 causes the tape moving unit 54 to move the expansion sheet 11 upward, to separate the expansion sheet 11 from the upper surface 34 of the plate 31, after which the expanding apparatus 20 causes the moving units 58-1, 58-2, 58-3, and 58-4 to move the holding units 51-1, 51-2, 51-3, and 51-4 in the first direction 21 or the second direction 22 for spacing away from each other. As a result, the expansion sheet 11 is expanded both in the first direction 21 and in the second direction 22 attendant on the movements of the holding units 51-1, 51-2, 51-3, and 51-4. As a result of the expansion of the expansion sheet 11, tensile forces in the first direction 21 and the second direction 22 act on the expansion sheet 11.

When the tensile forces in the first direction 21 and the second direction 22 thus act on the expansion sheet 11 with the workpiece 1 adhered thereto, the workpiece 1, which has been formed with the modified layers 14 along the streets 5, is divided along the streets 5 into the individual devices 2 with the modified layers 14 as start points, and the DAF 4 is divided on the device 2 basis. Note that in the embodiment, the expansion sheet 11 is expanded after it is moved upward to be separated from the upper surface 34 of the plate 31 in the expanding step ST6, but, in the present invention, the expansion sheet 11 may be expanded while kept in contact with the upper surface 34 of the plate 31 without being moved upward. After the expanding step ST6, the expanding method proceeds to the workpiece heating step ST8.

<Plate Heating Step>

Figure 13:
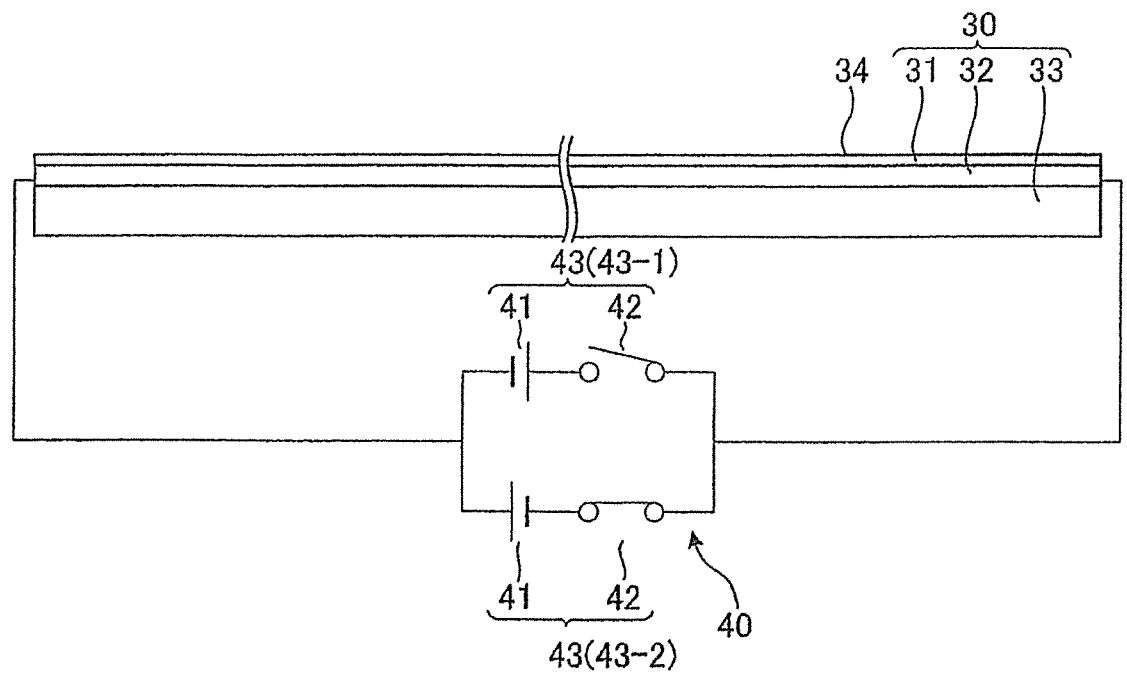
FIG. 13 is a side view depicting a plate heating step of the expanding method depicted in FIG. 4.

FIG. 13 is a side view depicting the plate heating step of the expanding method depicted in FIG. 4. The plate heating step ST7 is a step of heating the plate 31, after the workpiece cooling step ST5 is performed.

In the embodiment, in the plate heating step ST7, as depicted in FIG. 13, the expanding apparatus 20 opens the switch 42 of the power source unit 43-1 on one side of the polarity change-over power source unit 40, and closes the switch 42 of the power source unit 43-2 on the other side, to heat the plate 31 by the Peltier elements in the Peltier element layer 32. In the embodiment, in the plate heating step ST7, the plate 31 is heated until the temperature at the upper surface 34 thereof is brought to a heating temperature of 20° C. to 30° C. Note that in the embodiment, the cooling/heating unit 30 keeps heating the plate 31 to a temperature on the order of 20° C. to 30° C. by passing a current in the state denoted in FIG. 13, normally including the period of stand-by other than the periods of cooling the workpiece 1, namely, the plate cooling step ST4 and the workpiece cooling step ST5. By this, the expanding apparatus 20 keeps heating the plate 31 to around normal temperature even in the period of stand-by, whereby the heat accumulated in the heat radiation plate 33 is cooled, which produces such an effect that the plate 31 can be cooled in a short time. After the plate heating step ST7, the expanding method proceeds to the workpiece heating step ST8.

<Workpiece Heating Step>

Figure 14:
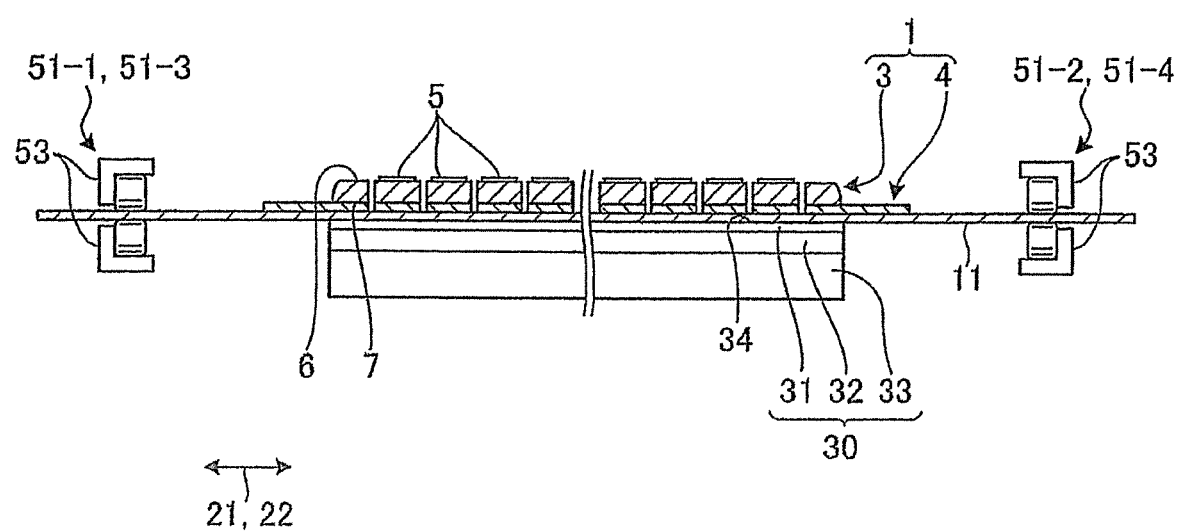
FIG. 14 is a side view depicting, partly in section, a workpiece heating step of the expanding method depicted in FIG. 4.

FIG. 14 is a side view depicting, partly in section, the workpiece heating step of the expanding method depicted in FIG. 4. The workpiece heating step ST8 is a step of bringing the plate 31 into contact with the workpiece 1 through the expansion sheet 11 to heat the workpiece 1, after the expanding step ST6 and the plate heating step ST7 are performed.

In the embodiment, in the workpiece heating step ST8, the expanding apparatus 20 causes the tape moving unit 54 to lower the expansion sheet 11, to bring the expansion sheet 11 into contact with the upper surface 34 of the plate 31, as illustrated in FIG. 14. In the embodiment, in the workpiece heating step ST8, the expanding apparatus 20 brings the expansion sheet 11 into contact with the upper surface 34 of the plate 31, to heat the wafer 3 and the DAF 4 of the workpiece 1, thereby removing frost or dew generated on the front surface 6 of the wafer 3. After the workpiece heating step ST8, the expanding method proceeds to the frame attaching step ST9.

<Frame Attaching Step>

Figure 15:
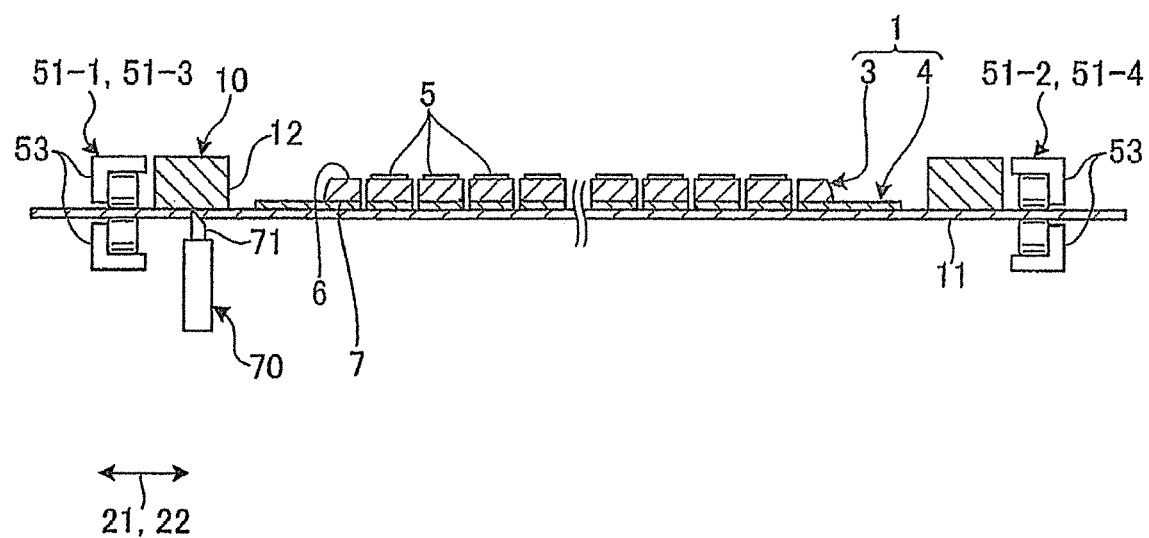
FIG. 15 is a side view depicting, partly in section, a frame attaching step of the expanding method depicted in FIG. 4.

FIG. 15 is a side view depicting, partly in section, the frame attaching step of the expanding method depicted in FIG. 4. The frame attaching step ST9 is a step of attaching the frame 10 to the expansion sheet 11, after the workpiece heating step ST8 is performed.

In the embodiment, in the frame attaching step ST9, the expanding apparatus 20 causes the tape moving unit 54 to move the expansion sheet 11 upward, to separate the expansion sheet 11 from the upper surface 34 of the plate 31, after which the frame 10 is positioned at such a position that the opening 12 of the frame 10 and the workpiece 1 adhered to the expansion sheet 11 face each other and that the frame 10 is spaced from the expansion sheet 11. In the frame attaching step ST9, as depicted in FIG. 15, the expanding apparatus 20 lowers the frame carrying unit 60, whereby the frame 10 held by the frame carrying unit 60 is attached to the expansion sheet 11, and the expanding apparatus 20 causes the cutter 71 of the sheet cutting unit 70 to cut the expansion sheet 11 along the frame 10. After the frame attaching step ST9, the expanding method is finished.

In the expanding method and the expanding apparatus 20 according to the embodiment, after the workpiece cooling step ST5 is performed, the expanding step ST6 is conducted, and then the workpiece heating step ST8 is carried out. Therefore, the dew or frost generated in the workpiece cooling step ST5 can be removed by heating, and troubles due to the dew or frost can be prevented from being generated in the later steps. In addition, in the expanding method and the expanding apparatus 20, the cooling/heating unit 30 for cooling the workpiece 1 includes the plate 31 that makes contact with the workpiece 1 to cool the workpiece 1, and the Peltier element layer 32 for cooling the plate 31. Therefore, it is unnecessary to provide a cooling chamber for accommodating and cooling the workpiece 1, and, accordingly, the expanding apparatus 20 can be restrained from being enlarged in size. As a result, in the expanding method and the expanding apparatus 20 according to the embodiment, the workpiece 1 inclusive of the DAF 4 can be divided into the individual devices 2 while restraining enlargement of the apparatus, and troubles due to the dew or frost deposited on the front surface 6 of the workpiece 1 can be restrained from occurring in the later steps.

Besides, in the expanding method and the expanding apparatus according to the embodiment, the cooling/heating unit 30 includes the Peltier element layer 32, and cools and heats the workpiece 1. Therefore, an increased in the number of component parts of the expanding apparatus 20 can be restrained, and enlargement of the apparatus itself can be restrained.

In addition, in the expanding method and the expanding apparatus 20 according to the embodiment, the cooling/heating unit 30 includes the Peltier element layer 32, and cools and heats the workpiece 1; therefore, it is unnecessary to cover with a cooling chamber the whole of the expanding apparatus 20 that holds the edges of the expansion sheet 11 and expands the expansion sheet 11. As a result, in the expanding method and the expanding apparatus 20 according to the embodiment, enlargement of the expanding apparatus 20 that holds the edges of the expansion sheet 11 and expands the expansion sheet 11 can be restrained. The effect such that enlargement of the expanding apparatus itself can be restrained is conspicuous particularly in the case where the apparatus includes the aforementioned sheet holding unit, delivery unit, and cutting unit.

Note that the present invention is not limited to the above-described embodiment. The present invention can be carried out with various modifications without departing from the scope of the gist of the invention. For example, in the embodiment, the expanding apparatus 20 causes the tape moving unit 54 to lower the expansion sheet 11 in the workpiece cooling step ST5, to move the expansion sheet 11 upward in the expanding step ST6, to lower the expansion sheet 11 in the workpiece heating step ST8, and to move the expansion sheet 11 upward in the frame attaching step ST9. In the present invention, however, the expanding apparatus 20 may move the cooling/heating unit 30 upward or downward, in the workpiece cooling step ST5, the expanding step ST6, the workpiece heating step ST8, and the frame attaching step ST9. In this case, in the frame attaching step ST9, the expansion sheet 11 may not be moved upward, the cooling/heating unit may be lowered and retracted, and the frame carrying unit 60 may be lowered to attach the frame 10.

In addition, in the embodiment, the wafer 3 and the DAF 4 are divided together (namely, the object to be processes is the wafer and the ductile material). However, the present invention is preferable also in the case of dividing only the DAF 4 adhered to the wafer 3 individualized into the devices 2 by grinding conducted after half-cutting or modified layer formation along the streets 5 (in other words, the case where the object to be processed is only the ductile material).

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. An expanding apparatus for expanding an expansion sheet to which a workpiece including at least a ductile material is adhered, the expanding apparatus comprising:
   expanding means expanding the expansion sheet, wherein the expanding means includes a plurality of moving units that are each configured and arranged to move an associated holding unit, and further wherein each of said holding units is configured and arranged to clamp and hold a portion of the expansion sheet;
   cooling/heating means that includes a plate having a contact surface for contact with the workpiece and brought into contact with the workpiece through the expansion sheet, and a Peltier element for cooling or heating the plate; and
   polarity change-over means changing over the polarity of a current passed to the Peltier element, wherein the polarity change-over means is configured and arranged to be switched between a first status in which the plate is cooled and a second status in which the plate is heated.

2. The expanding apparatus according to claim 1, wherein the polarity change-over means comprises:
   a first power source and a first switch connected in series with each other; and
   a second power source and a second switch connected in series with each other,
   wherein the first power source and the second power source are connected in parallel with each other,
   and further wherein when the first switch is in a closed position and the second switch is in an open position, the polarity change-over mean operates under the first status, and when the first switch is in an open position and the second switch is in a closed position, the polarity change-over mean operates under the second status.

3. The expanding apparatus according to claim 2, wherein:
   the first power source comprises a first DC power source; and
   the second power source comprises a second DC power source.

4. The expanding apparatus according to claim 1, wherein the Peltier element includes a first surface and a second surface facing an opposite direction from the first surface, and further wherein the plate is positioned on the first surface of the Peltier element.

5. The expanding apparatus according to claim 4, further comprising a heat radiation plate positioned on the second surface of the Peltier element.

6. The expanding apparatus according to claim 5, wherein:
   when the polarity change-over means is operating under the first status, heat absorption occurs on the first surface of the Peltier element to cool the plate, and heat discharge occurs on the second surface of the Peltier element to heat the heat radiation plate, and
   when the polarity change-over means is operating under the second status, heat absorption occurs on the second surface of the Peltier element layer to cool the heat radiation plate, and heat discharge occurs on the first surface of the Peltier element to heat the plate.

7. The expanding apparatus according to claim 6, wherein:
   the first power source comprises a first DC power source; and
   the second power source comprises a second DC power source.

* * * * *